United States Patent [19]

Iwakura et al.

[11] Patent Number: 5,202,304

[45] Date of Patent: Apr. 13, 1993

[54] RECORDING MEDIUM

[75] Inventors: Ken Iwakura; Yuuichi Fukushige; Shintaro Washizu, all of Shizuoka, Japan

[73] Assignee: Fuji Photo Film Co., Ltd., Kanagawa, Japan

[21] Appl. No.: 714,521

[22] Filed: Jun. 13, 1991

[30] Foreign Application Priority Data

Jun. 14, 1990 [JP] Japan .................................. 2-156381

[51] Int. Cl.$^5$ .............................................. B41M 5/30
[52] U.S. Cl. .................................. 503/209; 503/216; 503/225
[58] Field of Search ................ 503/216, 217, 225, 209

[56] References Cited

U.S. PATENT DOCUMENTS 4,513,052 4/1985 Kubo et al. .......................... 503/217
4,707,463 11/1987 Ikeda et al. .......................... 503/209

OTHER PUBLICATIONS

Patent Abstracts of Japan, vol. 10, 163 (M-487) (2219) Jun. 11, 1986, & JP-A-61-14981 (Fuji Photo Film Co., Ltd.) Jan. 23, 1986.

Patent Abstracts of Japan, Inc., vol. 10, No. 47 (M-456) (2104) Feb. 25, 1986, JP-A-60-198290 (Fuji Photo Film Co., Ltd.) Oct. 7, 1985.

*Primary Examiner*—Pamela R. Schawartz
*Attorney, Agent, or Firm*—Sughrue, Mion, Zinn, Macpeak & Seas

[57] ABSTRACT

A recording medium which comprises a support having thereon a layer containing an electron-donating achromatic dye incorporated in microcapsules and an electron-accepting compound, wherein said electron-accepting compound is a 3-halo-4-hydroxybenzoic acid ester having a polymerizable ethylene group. The recording medium provides a high color density at image part, a low fog density at non-image part and markedly high stability of the non-image part.

9 Claims, No Drawings

RECORDING MEDIUM

FIELD OF THE INVENTION

This invention relates to a recording medium which can be applied to recording paper for use in facsimile, printer paper and the like, film for presentation use, recording film for medical use, proof for print proofing and the like. More particularly, it relates to a light- and heat-sensitive recording medium in which the stability of non-image portions are improved.

BACKGROUND OF THE INVENTION

Recording media which employ an electron-donating achromatic dye and an electron-accepting compound include pressure sensitive paper, thermosensitive paper, light- and pressure-sensitive paper, electric heat-sensitive paper, thermosensitive transfer paper, and the like, and are disclosed in detail, for example, in British Patent 2,140,449, U.S. Pat. Nos. 4,480,052 and 4,436,920, JP-B-60-23992, (the term "JP-B" as used herein means an "examined Japanese patent publication"), and JP-A-57-179836, JP-A-60-123556, and JP-A-60-123557 (the term "JP-A" as used herein means an "unexamined published Japanese patent application").

Such prior art recording media in which an electron-donating leuco dye and an electron-accepting compound are used have a disadvantage in that a non-image portions inadvertently develop color caused by heating and the like after image recording. Consequently, intensive studies have been and continue to be conducted in the field with the aim of solving this problem.

As an attempt to improve stability of recording media, a recording medium in which an electron-donating achromatic dye is encapsulated in microcapsules has been proposed to insulate an electron-accepting compound from the achromatic dye as disclosed in JP-A-2-81671. However, satisfactory shelf life of images cannot be obtained even by the use of this method.

As a method for the development of image by uniform heating of a recording medium after image exposure, a process has been proposed in which a photopolymerizable composition and heat-sensitive coloring medium are used and a visible image is formed by heat developing treatment. According to this process, the photo-polymerizable composition is encapsulated in microcapsules, and as a result, the cured portions of the photo-polymerizable composition after image exposure are insulated from contact with the heat-sensitive coloring material so as to prevent color development in the cured portions. By this process, however, development of color on the photo-cured portions cannot be prevented satisfactorily at the time of the heat developing treatment, and, consequently, development of fog occurs on non-image portions.

In addition, another method has been proposed which comprises using microcapsules containing an electron-donating achromatic dye and a photo-polymerizable composition as disclosed in JP-B-60-30931 and a composition of an electron-accepting compound and a photo-polymerizable composition or a composition of a photo-polymerizable electron-accepting compound. This process, however, is not satisfactory with regard to the color developing density.

SUMMARY OF THE INVENTION

An object of the present invention is to provide a heat-sensitive recording medium which shows a high color developing density and improved shelf life for the non-image portions. Another object of the present invention is to provide a light- and heat-sensitive recording medium in which a polymer image obtained by photo-curing is converted into visible image by heat developing treatment.

The above objects were attained by a recording medium comprising a support having thereon at least one layer containing an electron-donating achromatic dye included in microcapsules and an electron-accepting compound, wherein the electron-accepting compound is a 3-halo-4-hydroxybenzoic acid ester having a polymerizable ethylene group.

DETAILED DESCRIPTION OF THE INVENTION

According to the recording medium of the present invention, a visible image is obtained as a result of the development of color only at the unexposed (uncured) portions or regions on the recording medium, which is effected by recording an image on the medium by means of a thermal head or the like and then curing the image and non-image portions or regions by total exposure, or by curing exposed portions or regions upon image exposure and then heating the medium evenly.

The recording medium according to the present invention can be made into various construction forms depending on the object. In a preferable construction, a support is coated with a layer which comprises minute liquid droplets of a photo-curable composition containing an electron-accepting compound and microcapsules containing an electron-donating achromatic dye. In another preferable construction, a support is coated with a layer in which microcapsules including an electron-donating achromatic dye are dispersed in a continuous phase of a photo-curable composition containing an electron-accepting compound. Such a continuous phase may be a mixture of the photo-curable composition and a binder.

In still another preferable construction, a support is coated with a layer in which a photo-curable composition containing an electron-accepting compound and microcapsules including an electron-donating achromatic dye are dispersed in a continuous phase which substantially comprises a binder. In each case of these constructions, the electron-accepting compound may be used in combination with a photo polymerization initiator.

The recording medium of the present invention may be either a monochrome, so-called "B/W", recording medium or a multi color recording medium. A suitable construction of a multi color recording medium comprises multiple layers wherein each layer contains a photo-curable composition having a different wave length sensitivity and microcapsules containing an electron-donating achromatic dye which develops a different hue. For example, such construction may comprise a support having thereon a first layer containing microcapsules including a cyan-developing electron-donating achromatic dye and a photo-curable composition having a sensitivity to λ1 wave length, a second layer containing of microcapsules which include a magenta-developing electron-donating achromatic dye and a photo-curable composition having a sensitivity to λ2 wave length provided on the first layer, and a third layer containing of microcapsules including a yellow-developing electron-donating achromatic dye and a photo-curable composition having a sensitivity to λ3 wave length provided on the second layer. Intermediate layers may be inserted among these multiple layers, and such intermediate layers may contain an ultraviolet ray absorbing agent.

The 3-halo-4-hydroxybenzoic acid ester having a polymerizable ethylene group according to the present invention is preferably selected from compounds represented by formula (I):

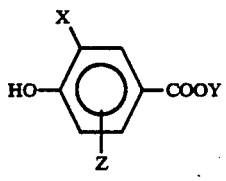

wherein X is a halogen atom, Y is a monovalent group having a polymerizable ethylene group and Z is a hydrogen atom, an alkyl group or an alkoxy group.

The halogen atom represented by X is preferably a chlorine atom. As the monovalent group having a polymerizable ethylene group represented by Y, an aralkyl group having a vinyl group, an acryloyloxyalkyl group or a methacryloyloxyalkyl group, each having from 5 to 20 carbon atoms are preferable. Z is preferably a hydrogen atom, an alkyl group or an alkoxy group each having from 1 to 5 carbon atoms.

Specific examples, though not particularly limited thereto, of the 3-halo-4-hydroxybenzoic acid ester having a polymerizable ethylene group according to the present invention include β-vinylphenethyl 3-chloro-4-hydroxybenzoate, γ-vinylphenylpropyl 3-chloro-4-hydroxybenzoate, (2-acryloyloxyethyl) 3-chloro-4-hydroxybenzoate, (2-methacryloyloxyethyl) 3-chloro-4-hydroxybenzoate, (2-acryloyloxypropyl) 3-chloro-4-hydroxybenzoate, (2-methacryloyloxypropyl) 3-chloro-4-hydroxybenzoate, (3-acryloyloxypropyl) 3-chloro-4-hydroxybenzoate, (3-methacryloyloxypropyl) 3-chloro-4-hydroxybenzoate, (4-acryloyloxybutyl) 3-chloro-4-hydroxybenzoate, (4-methacryloyloxybutyl) 3-chloro-4-hydroxybenzoate, (2-acryloyloxyethyl) 3-fluoro-4-hydroxybenzoate, (5-methacryloyloxypentyl) 3-chloro-4-hydroxybenzoate, (5-acryloyloxypentyl) 3-chloro-4-hydroxybenzoate, (6-methacryloyloxyhexyl) 3-chloro-4-hydroxybenzoate and (6-acryloyloxyhexyl) 3-chloro-4-hydroxybenzoate.

These electron-accepting compounds may be used alone or in combination with other polymerizable or non-polymerizable electron-accepting compounds. Examples of such other polymerizable electron-accepting compounds include a methacryloxyethyl ester of benzoic acid having hydroxy group as disclosed in JP-A-63-173682 or an acryloxyethyl ester which can be synthesized by the same method disclosed in JP-A-63-173682, an ester of benzoic acid having hydroxy group and hydroxymethylstyrene as disclosed in JP-A-59-83693, JP-A-60-141587 and JP-A-62-99190, a hydroxystyrene as disclosed in European Patent 29,323, an N-vinylimidazole complex of a zinc halide as disclosed in JP-A-62-167077 and JP-A-62-16708, a developer monomer as disclosed in JP-A-63-317558 and the like. Non-polymerizable electron-accepting compounds include phenol derivatives, derivatives of salicylic acid, metal salts of aromatic carboxylic acids, acid clay, bentonite, novolak resins, metal-treated novolak resins, metal complexes and the like. Examples of these non-polymerizable electron-accepting compounds are disclosed for instance in JP-B-40-9309, JP-B-45-14039, JP-A-52-140483, JP-A-48-51510, JP-A-57-210886, JP-A-58-87089, JP-A-59-11286, JP-A-60-176795 and JP-A-61-95988, which include: phenolic compounds such as 2,2'-bis(4-hydroxyphenyl) propane, 1,1'-bis(3-chloro-4-hydroxyphenyl) cyclohexane, 1,1'-bis(4-hydroxyphenyl) cyclohexane, 1,1'-bis(3-chloro-4-hydroxyphenyl)-2-ethylbutane, 4,4'-sec-isooctylidene diphenol, 4,4'-sec-butylidene diphenol, 4,4'-isopentylidene phenol and benzyl p-hydroxybenzoate; salicylic acid derivatives such as 3-dodecyl salicylic acid, 3,5-di(α-methylbenzyl) salicylic acid, 3,5-di(ter-octyl) salicylic acid, 3-dodecyl-5-methyl salicylic acid, 5-α-(p-α-methylbenzylphenyl) ethyl salicylic acid, 3-α-methylbenzyl-5-ter-octyl salicylic acid, 3-nonyl-5-methyl salicylic acid, 3,5-dinonyl salicylic acid, 3-nonyl-5-terbutyl salicylic acid, 4-dodecyloxy salicylic acid, 3-α,α-dimethylbenzyl-6-methyl salicylic acid and 3,5-bis-α,α-dimethylbenzyl-6-methyl salicylic acid; and zinc, aluminum, and nickel salts of these salicylic compounds.

When these electron-accepting compounds, are used in combination with the 3-halo-4-hydroxybenzoic acid esters of the present invention, the 3-halo-4-hydroxybenzoic acid ester electron-accepting compound of the present invention may be used in an amount of 50% by weight or more, preferably 70% by weight, or more based on the total weight of the electron-accepting compounds.

In accordance with the present invention, the 3-halo-4-hydroxybenzoic acid ester electron-accepting compound can be used in combination with a polymerizable compound having at least one polymerizable ethylene group in the molecule. Examples of such a polymerizable compound are those selected from acrylic acid and its salts, acrylic acid esters, acrylamides, methacrylic acid and its salts, methacrylic acid esters, methacrylamides maleic anhydride, maleic acid esters, itaconic acid, itaconic acid esters, styrenes, vinyl ethers, vinyl esters, heterocyclic N-vinyl compounds, aryl ethers, allyl esters and the like. Among these, a polymerizable compound having a plurality of ethylenic double bonds in its molecule is preferably used. For examples, such a compound is selected from the acrylic acid esters and methacrylic acid esters of polyhydric alcohol such as trimethylolpropane and pentaerythritol, epoxy resins having acrylate or methacrylate terminals, polyesters having acrylate or methacrylate terminals and the like. Most preferable compounds include ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate, diethylene glycol dimethacrylate and the like.

The molecular weight of the multifunctional monomer, or the polymerizable compound, may preferably be in the range of from about 100 to about 5000, more preferably from about 300 to about 2000.

The electron-accepting compound of the present invention, when used in combination with other polymerizable compound, is used in an amount of 60% by weight or more, preferably 70% by weight or more based on the total weight of the polymerizable compound.

In addition to these compounds, polyvinyl cinnamate, polyvinyl cinnamylideneacetate, a light-sensitive resin having α-phenylmaleimide group or the like may be used as a photo cross-linking composition.

If necessary, a heat polymerization inhibitor may also be used. Such an inhibitor prevents heat- or time-dependent polymerization of the photo-polymerizable composition to thereby improve chemical stability of the photo-polymerizable composition during its preparation and storage.

A photo polymerization initiator suitable for use in the present invention is selected from the aforementioned compounds which have ethylenic unsaturated bonds and can initiate photo polymerization. These compounds may be used alone or as a mixture of two or more.

Specific examples of preferable photo polymerization initiators include: aromatic ketones such as benzophenone, 4,4'-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzyl anthraquinone, 2-tert-butylanthraquinone, 2-methylanthraquinone, xanthone, thioxanthone, 2-chlorothioxanthone, 2,4-diethylthioxanthone, fluorenone, acridone and the like; benzoin and benzoin ethers such as benzoin methyl ether, benzoin ethyl ether, benzoin isopropyl ether, benzoin phenyl ether and the like; 2,4,5-triarylimidazol dimers such as 2-(o-chlorophenyl)-4,5-diphenylimidazol dimer, 2-(o-chlorophenyl)-4,5-di(m-methoxyphenyl)imidazole dimer, 2-(o-fluoropheyl)-4,5-diphenylimidazol dimer, 2-(o-methoxyphenyl)-4,5-diphenylimidazol dimer, 2-(p-methoxyphenyl)-4,5-diphenylimidazol dimer and the like; polyhalogenides such as carbon tetrabromide, phenyltribromomethyl sulfone, phenyltrichloromethyl ketone and the like, and compounds disclosed in JP-A-53-133428, JP-B-57-1819, JP-B-57-6096 and U.S. Pat. No. 3,615,455; and S-triazine derivatives having trihalogen-substituted methyl groups disclosed in JP-A-58-29803 such as 2,4,6-tris(trichloromethyl)-S-triazine, 2-methoxy-4,6-bis(trichloromethyl)-S-triazine, 2-amino-4,6- bis(trichloromethyl)-S-triazine, 2-(p-methoxystyryl)-4,6-bis(trichloromethyl)-S-triazine and the like. Also included are organic peroxides disclosed in JP-A-59-189340 such as methyl ethyl ketone peroxide, cyclohexanone peroxide, 3,3,5-trimethylcyclohexanone peroxide, benzoyl peroxide, di-tert-butyl-di-peroxyisophthalate, 2,5-dimethyl-2,5-di(benzoylperoxy)hexane, tert-butylperoxybenzoate, $\alpha,\alpha\alpha$-bis(tert-butylperoxyisopropyl)benzene, dicumyl peroxide, 3,3',4,4'-tetra-(tert-butylperoxycarbonyl)benzophenone and the like. Also included are azinium compounds disclosed in U.S. Pat. No. 4,743,530, and organic boron compounds disclosed in European Patent 0,223,587 such as tetramethylammonium salts of triphenylbutylborate, tetrabutylammonium salts of triphenylbutylborate, tetramethylammonium salts of tri(p-methoxyphenyl)butylborate and the like. Other well known prior art photo polymerization initiators such as diaryliodonium salts and iron-allene complexes may also be used.

In addition, other combinations of two or more compounds as a photo polymerization initiator system can be applied to the present invention. Examples of such combinations include a combination of 2,4,5-triarylimidazole dimer and mercaptobenzoxazole or the like, a combination of 4,4'-bis(diethylamino)benzophenone and benzophenone or benzoin methyl ether as disclosed in U.S. Pat. No. 3,427,161, a combination of benzoyl-N-methylnaphthothiazoline and 2,4-bis(trichloromethyl)-6-(4,-methoxyphenyl)-triazol as disclosed in U.S. Pat. No. 4,239,850, a combination of dialkylaminobenzoic acid ester and dimethylthioxanthone as disclosed in JP-A-57-23602 and a triple combination of 4,4'-bis(dimethylamino)benzophenone, benzophenone and a polyhalogenated methyl compound as disclosed in JP-A-59-78339. Further, combination of 4,4,-bis(diethylamino)benzophenone and benzophenone, a combination of 2,4-diethylthioxanthone and 4-dimethylaminoethyl benzoate and a combination of 4,4,-bis(dimethylamino)benzophenone, and 2,4,5-triarylimidazole dimer are even more preferable.

The photo polymerization initiator is preferably used in an amount of from 0.01 to 20% by weight on the basis of the total weight of the photo polymerizable composition, more preferably from 0.2 to 15% by weight, most preferably from 5 to 10% by weight. The amount of less than 0.01% by weight would cause insufficient sensitivity and the amount of more than 20% by weight would provide no proportional increase in sensitivity.

In addition to the polymerizable electron-accepting compound and photo polymerization initiator, a spectral sensitization dye may also be applied to the recording medium of the present invention for the purpose of controlling the sensitization wave length. Such a spectral sensitization dye may be selected from various compounds known in the art, by consulting for example the aforementioned patents with regard to photo polymerization initiators, Research Disclosure, vol. 200, Item 20036 (December, 1980) and "Zokanzai" (Sensitizer) (pages 160 to 163; edited by Katsumi Tokumaru and Shin Ohgawara, published from Kodansha in 1987). Examples of spectral sensitization dyes include 3-keto-coumalin compounds as disclosed in JP-A-58-15503, thiopyrylium salts as in JP-A-58-40302, naphthothiazole merocyanine compounds as in JP-A-59-40302 and JP-B-60-53300 and merocyanine compounds as in JP-B-61-9621, JP-B-62-3842, JP-A-59-89303 and JP-A-60-60104. By the use of these spectral sensitization dyes, spectral sensitivity of a photo polymerization initiator can be extended to the visible wave length. Specific examples of spectral dyes include: keto pigments such as a coumalin pigment (including ketocoumalin or sulfonocoumalin), a merostyryl pigment, an oxonol pigment and a hemioxonol pigment; non-keto pigments such as a non-keto polymethine pigment, an anthracene pigment, a rhodamine pigment, an acridine pigment, an aniline pigment and an azo pigment; non-keto-polymethine pigments such as cyanine, hemicyanine and a styryl pigment; and the like.

In addition, the photo polymerizable composition of the present invention may be used in combination with polymerization enhancing auxiliaries such as reducing agents like an oxygen scavenger and chain transfer agents of active hydrogen donors, as well as other compounds which enhance the polymerization in a chain transfer mode. Oxygen scavengers include phosphines, phosphonates, phosphites and stannous salts, as well as other compounds which can be oxidized easily by oxygen such as N-phenylglycine, trimethylbarbiturate, N,N-dimethyl-2,6-diisopropylaniline, trimethylbarbiturate, N,N-dimethyl-2,6-diisopropylaniline, N,N,N-2,4,6-pentamethylaniline and the like. Also useful as polymerization enhancers are thiols, thioketones, trihalomethyl compounds, lophine dimer compounds, iodonium salts, sulfonium salts, azinium salts, organic peroxides and the like.

Various compounds may be useful as the electron-donating achromatic dye of the present invention, such as triphenylmethanephthalide compounds, fluoran compounds, xanthene compounds, phenothiazine compounds, indolylphthalide compounds, leucoauramine compounds, rhodamine lactam compounds, triphenylmethane compounds, triazene compounds, spiropyran compounds, fluorene compounds and pyridine and pyrazine compounds.

Specific examples of the electron-donating achromatic dye compounds are disclosed in many patents, for instance: phthalide compounds in reissued U.S. Pat. No. 23,024, U.S. Pat. Nos. 3,491,111, 3,491,112, 3,491,116 and 3,509,174; fluoran compounds in U.S. Pat. Nos. 3,624,107, 3,627,787, 3,641,011, 3,462,828, 3,681,390, 3,920,510 and 3,959,571; spiro-di-pyran compounds in U.S. Pat. No. 3,971,808; pyridine- and pyrazine-based compounds in U.S. Pat. Nos. 3,775,424, 3,853,869 and 4,246,318; and fluorene compounds in JP-A-63-94878.

If electron-donating achromatic dyes are used in a full-color recording medium, useful dyes of various coloring types can be found in many patents and publications. For example, suitable magenta coloring type dyes are disclosed in U.S. Pat. No. 4,800,149, DT-AS 2,265,233, DT-OS 2,409,112, JP-A-2-178087 and other patents, yellow coloring types are disclosed in U.S. Pat. Nos. 4,800,148, 4,775,656, 4,540,790, 4,025,090, 4,446,321, 4,365,503, 4,820,841, 4,598,150, JP-A-62-288827, JP-A-62-288828, JP-A-63-251280, JP-A-63-251279, JP-A-63-251278, JP-A-64-25148, and British Patent 1,431,493, and cyan coloring types are disclosed for instance in JP-A-63-53542, JP-A-62-270662, JP-A-63-113446, JP-A-63-112188, JP-A-1-213636 and European Patent 82822.

According to the recording medium of the present invention, preferably 1 to 100 moles of the electron-accepting compound is mixed with one mole of the electron-donating achromatic dye. In other words, the amount of the electron-donating achromatic dye per one coloring layer is in the range of from 0.1 to 2 $g/m^2$, preferably from 0.2 to 1 $g/m^2$, while that of the electron-accepting compound is in the range of from 0.2 to 20 $g/m^2$, preferably from 0.4 to 10 $g/m^2$.

The electron-donating achromatic dye of the present invention can be included in microcapsules by any conventional means well known in the related field, such as methods disclosed in U.S. Pat. No. 2,800,457 and U.S. Pat. No. 2,800,458 in which coacervation of a hydrophilic wall forming material is employed, interfacial polymerization methods disclosed in U.S. Pat. No. 3,287,154, British Patent 990,443, JP-B-38-19574, JP-B-42-446 and JP-B-42-771, polymer precipitation methods disclosed in U.S. Pat. No. 3,418,250 and U.S. Pat. No. 3,660,304, a method disclosed in U.S. Patent precipitation methods disclosed in U.S. Pat. No. 3,418,250 and U.S. Pat. No. 3,660,304, a method disclosed in U.S. Pat. No. 3,796,669 in which an isocyanate polyol is used as a wall forming material, a method disclosed in U.S. Pat. No. 3,914,511 in which an isocyanate compound is used as a wall forming material, methods disclosed in U.S. Pat. No. 4,001,140, U.S. Pat. No. 4,087,376 and Patent 4,089,802 in which a ureaformaldehyde system or a urea-formaldehyde-resorcinol system is used as a wall forming material, a method disclosed in U.S. Pat. No. 4,025,455 in which a melamine-formaldehyde resin, a hydroxypropyl cellulose or the like is used as a wall forming material, in situ monomer polymerization methods disclosed in JP-B-36-9168 and JP-A-51-9079, electrolytic dispersion cooling methods disclosed in British Patent 952,807 and British Patent 965,074, and spray drying methods disclosed in U.S. Pat. No. 3,111,407 and British Patent 930,422. Though not restricted to these methods, it is preferable to form polymer membranes as microcapsule walls after completion of core material emulsification.

Microcapsule wall of the present invention may be effectively prepared especially by the use of a method in which the wall is formed by polymerization of a reactant inside an oil drop. By such a method, capsules having a homogeneous particle size and excellent shelf life as a recording medium and can be manufactured within a short period of time.

For example, in the case of the use of polyurethane as the capsule wall material, microcapsule walls may be prepared by mixing a polyvalent isocyanate and, if necessary, a second material which forms a capsule wall by reacting with the polyvalent isocyanate (for example, a polyol or a polyamine) with an oily liquid to be made into capsules, then emulsifying and dispersing the resulting mixture in water and then raising the temperature of the emulsified dispersant to generate polymer formation reaction at the interface of oil drops. In this instance, an auxiliary solvent having a low boiling point and a high solubility may be added to the oily liquid. Examples of polyvalent isocyanates, and polyols and polyamines to be reacted therewith are disclosed in U.S. Pat. Nos. 3,281,383, 3,773,695, and 3,793,268, JP-B-48-40347, JP-B-49-24159, JP-A-48-80191 and JP-A-48-84086.

Water soluble polymers may be useful for the preparation of microcapsules. In this instance, any of anionic, nonionic and amphoteric water soluble polymers may be effective.

As water soluble anionic polymers, both natural and synthetic polymers may be useful which for example have a $—COO^-$ group, a $—SO_2^-$ group and the like. Specific examples of water soluble anionic polymers include: natural polymers such as gum arabic, alginic acid, pectin and the like; semisynthetic polymers such as carboxymethyl cellulose, phthalate gelatin, sulfated starch, sulfated cellulose, lignin sulfonate and the like; and synthetic polymers such as copolymers of maleic anhydride (including hydrolyzed products), polymers and copolymers of acrylic acid (including methacrylic acid), polymers and copolymers of vinylbenzenesulfonate, carboxy-modified polyvinyl alcohol and the like. As water soluble nonionic polymers, polyvinyl alcohol, hydroxyethyl cellulose, methyl cellulose and the like may be useful. Gelatin and the like may be effective as water soluble amphoteric polymers. These water soluble polymers may be used as an aqueous solution of 0.01 to 10 w/w %.

The size of capsules suitable for use in the present invention may be 80 μm or smaller, preferably 20 μm or smaller in view of preservation and handling considerations. If the capsule size is too small, however, an unnecessarily large amount of wall material is required because the surface area per solid material becomes large. The capsule size, therefore, may preferably be from about 0.1 μm to 80 μm.

The electron-donating achromatic dye of the present invention may be included in microcapsules in either a liquid or a solid form. When a solvent is used in combination in capsules, the amount of the solvent is preferably in the range of from 1.to 500 parts by weight based on 100 parts by weight of the electron-donating achromatic dye.

As solvents according to the present invention, natural and synthetic oils may be used in combination. Specific examples of these oils include cotton seed oil, kerosene, paraffin, naphthene oil, an alkylated biphenyl, an alkylated terphenyl, a chlorinated paraffin, an alkylated naththalene, diarylethanes such as 1-pehyl-1-xylylethane, 1-phenyl-1-p-ethylphenylethane, 1,1'-ditolylethane and the like, a phthalic acid ester, a phosphoric acid ester, a citric acid ester, a benzoic acid ester, an alkylamide, fatty acid esters, trimesic acid esters, a secondary butyl alcohol, methylisobutylketone, β-ethoxyethylacetate, methylcellosolve acetate, cyclohexanone and the like.

When microcapsules are prepared, a volatile solvent may be used as an auxiliary solvent to solubilize the electron-donating achromatic dye. Ethyl acetate, butyl acetate, methylene chloride and the like are examples of such a type of auxiliary solvent.

In the case of the use of the recording medium of the present invention as a multi color recording medium, the recording medium may be made as a multi-layer construction which comprises a layer of microcapsules in which an electron-donating achromatic dye that develops a preselected hue is included and another layer containing a photo-curable composition having a different wave length sensitivity than the microcapsule containing layer and, preferably, an intermediate layer containing an ultraviolet ray absorbing agent being inserted between these multiple layers.

Such an intermediate layer may contain mainly a binder and an ultraviolet ray absorbing agent and, if required, additives such as a curing agent, a polymer latex and the like.

As an ultraviolet ray absorbing agent, any compound known in the art may be useful, such as a benzotriazole compound, a cinnamic acid ester compound, an aminoallylidene malonitrile compound, a benzophenone compound or the like. The most preferable form of an ultraviolet ray absorbing agent have such a structure that the agent hardly diffuses into the adjoining layers; for example, a polymer or a latex copolymerized with an ultraviolet ray absorbing agent. Such a type of ultraviolet ray absorbing agent is disclosed, for example, in European Patent 127,819, JP-A-59-68731, JP-A-59-26733, JP-A-59-23344, British Patent 2,118,315, JP-A-58-111942, U.S. Pat. Nos. 4,307,184, 4,202,836, and 4,202,834, 4,207,254, and 4,178,303, and JP-A-47-560.

These ultraviolet ray absorbing agents are added to an intermediate layer but, if necessary, may be added to a protection layer, an anti-halation layer, as described below, and a light- and heat-sensitive layer, and the like.

According to the present invention, dispersion of the photo curable composition and dispersion and encapsulation of the electron-donating achromatic dye are carried out preferably using a water soluble polymer. Water soluble polymers suitable for the present invention may have a solubility of 5% by weight or more in water at 25° C. Specific examples of such water soluble polymers include: proteins such as gelatin, a gelatin derivative, albumin, casein and the like; cellulose derivatives such as methyl cellulose, carboxymethyl cellulose and the like; sodium alginate; sugar derivatives such as a starch derivative (including modified starch); gum arabic; synthetic polymers such as a polyvinyl alcohol, a hydrolyzed product of a styrene-maleic anhydride copolymer, a carboxy-modified polyvinyl alcohol, a polyacryl amide, a saponified product of a vinyl acetate-polyacrylic acid copolymer, a polystyrene sulfonate and the like; with most preferable polymers being gelatin and polyvinyl alcohol.

With regard to a binder for occasional use when appropriate in the recording medium of the present invention, the aforementioned water soluble polymers may also be useful in this regard, as well as solvent soluble polymers which include for example polystyrene, polyvinyl formal, polyvinyl butyral, acrylic resins such as polymethylacrylate, polybutylacrylate, polymethylmethacrylate, polybutylmethacrylate and their copolymers, phenol resins, styrene-butadiene resins, ethyl cellulose, epoxy resins, urethane resins and polymer latexes of these solvent soluble polymers, with most preferable polymers being gelatin and polyvinyl alcohol.

Various surfactants may be used in the recording medium of the present invention, with the aim of, for example, using the surfactant as a coating auxiliary agent, antistatic agent, sliding ability improving agent, emulsification and dispersion enhancing agent, adhesion preventative agent and the like. Such surfactants may be selected depending on the purpose from for example: nonionic surfactants including saponin, polyethylene oxides and derivatives of polyethylene oxides such as a polyethylene oxide alkyl ether: anionic surfactants including alkyl sulfonic acid esters, alkylbenzene sulfonic acid esters, alkylnaphthalene sulfonic acid esters, alkyl sulfuric acid esters, N-acryl-N-alkyltaurines, sulfosuccinic acid esters, sulfoalkylpolyoxyethylene alkylphenyl ether and the like; ampholytic surfactants including alkylbentaines, alkylsulfobetaines and the like; and cationic surfactants including aliphatic or aromatic quaternary ammonium salts and the like.

In addition to the aforementioned additive agents, many other agents may be added, if necessary, to the recording medium of the present invention. Typical examples of irradiation and halation-preventing dyestuffs, ultraviolet ray absorbing agents, plasticizers, fluorescent whitening agent, matting agents, coating auxiliaries, curing agents, antistatic agents, sliding improvers and the like are disclosed for instance in Research Disclosure, vol. 176, Item 17643 (December, 1978) and Research Disclosure, vol. 187, Item 18716 (November 1979).

The coating solution of the recording medium of the present invention comprises the aforementioned dispersions of each of the microcapsules and the electron-accepting compound and, if necessary, a photo polymerization initiator and other additive agents. The coating solution is coated on a support and then dried. When a multi color recording medium is prepared, intermediate layers and another light- and heat-sensitive layers are coated on the first light- and heat-sensitive layer repeatedly or simultaneously. Preferably, a protection layer may be coated on the uppermost layer.

Application of the coating solution to a support may be effected by the use of a blade coater, a rod coater, a knife coater, a roll doctor coater, a comma coater, a reverse roll coater, a transfer roll coater, a gravure coater, a kiss roll coater, a curtain coater, an extrusion coater or the like. Coating methods are disclosed for example in Research Disclosure, vol 200, Item 20036 (December, 1980). Thickness of the recording layer is preferably in the range of from 0.1 μm to 50 μm.

Examples of supports include paper materials such as paper, coated paper, laminated paper, synthetic paper and the like, transparent films such as polyethylene terephthalate film, cellulose triacetate film, polyethylene film, polystyrene film, polycarbonate film and the like and metal plates such as of aluminum, zinc, copper and the like, as well as modified products of these support materials in which the surface of each material is treated by various means such as surface treatment, under coating, metal vaporization and the like. Also useful are those supports disclosed in Research Disclosure vol 200, Item 20036 (December, 1980). If necessary, the surface of each support may be coated with an anti-halation layer and the backside with a sliding layer, an antistatic layer, a curling-preventing layer, an adhesive layer or the like depending on the purpose.

Since the recording medium of the present invention has a high recording sensitivity to a broad range of wave lengths from ultraviolet rays to visible rays, various light sources can be used such as a mercury lamp, a xenon lamp, a tungsten lamp, a metal halide lamp, various lasers including argon laser, helium neon laser, semi-conductor laser and the like, as well as LED, a fluorescent lamp and other suitable light sources.

Image recording in the practice of the present invention can be performed by various means including contact exposure of copies such as a lith film, blow-up exposure of slides, liquid crystal images and the like, reflection exposure making use of reflected light of copies, and other exposure means. Multi color recording may be effected by multiple image recording using different wave lengths. Different wave lengths may be obtained either by changing light sources or by changing optical filters. The recording medium of the present invention is also useful for direct printing of an image by a thermal head.

According to the recording medium of the present invention, a heat developing treatment is carried out after the aforementioned image exposure. Many commonly used heating methods can be applied to the heat developing treatment. For instance, the heating temperature may generally be in the range of from 80° to 200° C., preferably from 100° to 160° C. The heating time may be in the range of from 1 second to 5 minutes, preferably from 3 seconds to 1 minute. After the heat developing treatment, it is preferable to perform total area exposure to photo cure uncured parts.

The following Examples are given to illustrate the present invention but are not by way of limitation.

EXAMPLE 1

(1) Preparation of suspension of microcapsules including electron-donating achromatic dye To 12.4 g of 3,3-bis(1-octyl-2-methylindole-3-yl)phthalide dissolved in 10.4 g of ethyl acetate were added 12.4 g of dicyclohexyl phthalate, 27 g of Takeneito D-110N (capsule wall material, an isocyanic acid compound manufactured by Takeda Chemical Industries Ltd.) and 3 g of Millionate MR200 (capsule wall material, an isocyanic acid compound manufactured by Nippon Polyurethane Industry Co., Ltd.). The resulting solution was added to a mixture of 4.6 g of polyvinyl alcohol (PVA) and 74 g of water and then subjected to emulsification and dispersion at 20° C. to obtain an emulsion with mean particle size of 2.5 μm. The thus-obtained emulsion was mixed with 100 g of water and heated at 60° C. with stirring. After 2 hours of the heating, a suspension of microcapsules containing the electron-donating achromatic dye was obtained.

(2) Preparation of emulsion of photo curable composition

In 8 g of ethyl acetate were dissolved 0.12 g of 2-o-chlorophenyl-4,5-diphenylimidazole dimer (photopolymerizaion initiator), 0.12 g of 7-diethylamino-4-methylcoumarin (spectral sensitization dye) and, as an auxiliary to enhance polymerization, 0.06 g of N-phenylglycine ethyl ester. To the resulting solution was further added 8 g of 2-methacryloyloxyethyl 3-chloro-4-hydroxybenzoate. The thus-obtained solution was added to a mixture of 9.6 g of 7.5% PVA aqueous solution, 0.8 g of 2% aqueous solution of sodium nonylphenoxybutane sulfonate and 0.8 g of 2% aqueous solution of sodium dodecane sulfonate. Thereafter, the resulting mixture was subjected to emulsification using a homogenizer (manufactured by Nippon Seiki Co., Ltd.) at 10,000 rpm for 5 minutes to obtain an emulsion of a photo curable composition.

(3) Preparation of coating solution for use in light- and heat-sensitive layer

A coating solution for use in a light- and heat-sensitive layer was prepared by mixing 4 g of the electron-donating achromatic dye-containing microcapsule suspension with 12 g of the emulsion of photo-curable composition and 12 g of 15% aqueous solution of PVA.

(4) Preparation of coating solution for protection layer

A coating solution for use in a protection layer was prepared by mixing 4.5 g of 10% aqueous solution of gelatin with 1.5 g of distilled water, 0.5 g of 2% aqueous solution of sodium nonylphenoxybutane sulfonate, 1.5 g of 1% aqueous solution of sodium 2,4-dichloro-6-hydroxy-s-triazine, 1 g of Snowtex N (an adhension preventative agent, colloidal silica manufactured by Nissan Chemical Industries, Ltd.) and a predetermined amount of Syloid 72 (an adhension preventative agent, colloidal silica manufactured by Fuji-Devision Chemical Ltd.). Syloid 72 was used in such an amount that the coating amount became 50 mg/m$^2$.

(5) Preparation and evaluation of recording medium

The coating solution for light- and heat-sensitive layer was coated on the surface of a polyethylene terephthalate film having a thickness of 100 μm using a coating bar, in such an amount that dry weight of the resulting layer became 8 g/m$^2$ and the coated solution was dried at 30° C. for 10 minutes. The surface of the thus coated layer was further coated with the coating solution for providing a protection layer using a coating bar in such an amount that dry weight of the resulting protection layer became 5 g/m$^2$ and dried at 30° C. for 10 minutes.

Through a lith film on which an image has been developed, the thus prepared light- and heat-sensitive recording medium was exposed to ultraviolet rays for 60 seconds using a 1000 W high pressure mercury lamp (Jet Light, manufactured by Oak & Co., Ltd.). When the UV-exposed recording medium was heated at 110° C. for 5 seconds using a hot plate, a clear magenta-colored image was obtained. Color densities of the image and non-image parts were found to be 1.47 and 0.10, respectively. When the UV-exposed recording medium was maintained for 24 hours under conditions at 40° C. and at 90% RH in order to check shelf life of the image, the color density of the image did not change and the fog density of non-image part was found to be 0.13.

EXAMPLE 2

(1) Preparation of microcapsule suspension

In a solvent mixture of 55 of 1-phenyl-2-xylylethane and 55 g of methylene chloride were dissolved 14.0 g of 2-anilino-3-methyl-6-diethylaminofluoran, 60 g of Takeneito D-110N (capsule wall material, manufactured by Tekeda Chemical Industries Ltd.) and 2 g of Sumisorb 200 (ultraviolet ray absorbing agent, a benzotriazole compound manufactured by Sumitomo Chemical Co., Ltd.). The electron-donating achromatic dye solution thus prepared was mixed with 100 of 8% aqueous solution of polyvinyl alcohol, 40 g of water and 1.4 g of 2% aqueous solution of sodium diotyl sulfosuccinate, and the resulting mixture was emulsified using a homogenizer. Thereafter, the emulsion was mixed with 150 g of water and allowed to react at 40° C. for 3 hours to obtain a capsule suspension with mean capsule size of 0.7 $\mu$m.

(2) Preparation of dispersion of electron-accepting compound

In 8.0 g of ethyl acetate were dissolved 0.12 g of 2-(o-chlorophenyl)-4,5-diphenylimidazole dimer, (photo polymerization initiator), 0.12 g of 7-diethylamino-4-methylcoumarin (spectral sensitization dye), 0.1 g of N-phenylglycine ethyl ester and 8.0 g of 3-methacryloyloxypropyl 3-chloro-4-hydroxybenzoate. The thus-obtained solution was further mixed with 9.6 g of 7.5% aqueous solution of polyvinyl alcohol, 0.8 g of 2% aqueous solution of sodium nonylphenoxybutane sulfonate and 0.8 g of 2% aqueous solution of sodium dodecane sulfonate. Thereafter, the resulting mixture was subjected to emulsification using a homogenizer to obtain an emulsion dispersion of the electron-accepting compound.

(3) Preparation of recording medium

A coating solution was prepared by mixing 4.0 g of the electron-donating achromatic dye-containing microcapsule suspension with 12 g of the dispersion of the electron-accepting compound and 5.0 g of 15% aqueous solution of polyvinyl alcohol. The coating solution thus prepared was coated on the surface of a transparent polyethylene terephthalate (PET) film having a thickness of 70 $\mu$m in such an amount that the solid contents on the film became 15 g/m$^2$ and the coated solution was dried. The surface of the thus obtained heat-sensitive layer was further coated with 2.5 g/m$^2$ of a protection layer having the following composition:
- a silicon-modified polyvinyl alcohol (PVAR-2105, manufactured by Kuraray Co., Ltd.); 2 parts by weight,
- a colloidal silica (Snowtex 30, manufactured by Nissan Chemical Industries, Ltd.); 3 parts by weight,
- a paraffin wax emulsion (Cellosol 428, manufactured by Chukyo Yushi Co., Ltd.); 0.9 part by weight,
- and a zinc stearate emulsion (Hydrin Z-7, manufactured by Chukyo Yushi Co., Ltd.); 0.2 part by weight.

(4) Recording and evaluation of image

The thus-prepared recording medium was subjected to a heat print tester (manufactured by Kyocera Corp.) under a printing condition of 30 mJ/mm$^2$ to find a clear black image. When the image thus obtained was exposed to light using a 1000 W high pressure mercury lamp (Jet Light, manufactured by Oak & Co., Ltd.) and the exposed sample was again subjected to the heat print tester, un-printed parts showed no color development.

EXAMPLE 3

A dispersion of an electron-accepting compound was prepared in the same manner as in Example 2 except that 2-(o-chlorophenyl)-4,5-diphenylimidazole dimer, 7-diethylamino-4-methylcoumarin and N-phenylglycine ethyl ester were not used A coating solution was prepared by mixing 4.0 g of the electron-donating achromatic dye-containing microcapsule suspension obtained in Example 2 and 12 of the dispersion of the electron-accepting compound with 5.0 g of 15% aqueous solution of polyvinyl alcohol. The coating solution thus prepared was coated on the surface of a sheet of neutral paper having a quality of 50 g/m$^2$ in such an amount that the solid contents on the paper become 15 g/m$^2$ and the coated solution was dried. The surface of the thus obtained heat-sensitive layer was further coated with 2.5 g/m$^2$ of a protection layer used in Example 2. The thus-prepared recording medium was subjected to a heat print tester (manufactured by Kyocera Corp.) under a printing condition of 30 mJ/mm$^2$ to find a clear black image.

COMPARATIVE EXAMPLE 1

(1) Preparation of microcapsule suspension

In 10.4 g of ethyl acetate were dissolved 0.18 g of 2-o-chlorophenyl-4,5-diphenylimidazole dimer, 0.18 g of 7-diethylamino-4-methylcoumarin and, as an auxiliary to enhance polymerization, 0.09 g of N-phenylglycine ethyl ester. In the resulting solution were further dissolved 12.4 g of 3,3-bis(1-octyl-2-methylindole-3-yl)phthalide and 12.4 of trimethylolpropane triacrylate. To this were further added 27 g of Takeneito D-110N (manufactured by Takeda Chemical Industries Ltd.) and 3 g of Millionate MR200 (manufactured by Nippon Polyurethane Industry Co., Ltd.). The resulting solution was added to a mixture of 4.6 g polyvinyl alcohol and 74 g of water and then subjected to emulsification and dispersion at 20° C. to obtain an emulsion with mean particle size of 2.5 $\mu$m. The thus obtained emulsion was mixed with 100 g of water and heated at 60° C. with stirring. After 2 hours of the heating a suspension of capsules containing the electron-donating achromatic dye was obtained.

(2) Preparation of emulsion of electron-accepting compound

In 8 g of ethyl acetate was dissolved 8 g of $\beta$-resorcin benzyl ester. The thus-obtained solution was added to a mixture of 9.6 g of 7.5% PVA aqueous solution, 0.8 g of 2% aqueous solution of sodium nonylphenoxybutane sulfonate and 0.8 g of 2% aqueous solution of sodium dodecane sulfonate. Thereafter, the resulting mixture was subjected to emulsification using a homogenizer (manufactured by Nippon Seiki Co., Ltd.) at 10,000 rpm for 5 minutes to obtain an emulsion of an electron-accepting compound composition.

(3) Preparation of coating solution for light- and heat-sensitive layer

A coating solution for use in a light- and heat-sensitive layer was prepared by mixing 4 g of the electron-donating achromatic dye-containing microcapsule suspension with 12 g of the electron-accepting compound emulsion and 12 g of 15% aqueous solution of PVA.

(4) Preparation of coating solution for protection layer

A coating solution for use in a protection layer was prepared in the same manner as in Example 1.

(5) Preparation and evaluation of recording medium

A light- and heat-sensitive recording medium was obtained in the same manner as in Example 1.

When the thus-obtained light- and heat-sensitive recording medium was subjected to exposure and heat developing treatment, a clear magenta-colored image was obtained. Color density of the image was found to be 1.50, but that of the non-image part was 0.55. When the light-exposed recording medium was maintained for 24 hours under conditions at 40° C. and at 90% RH in order to check shelf life of the image, the color density of the image did not change but the fog density of the non-image part increased to 0.75.

COMPARATIVE EXAMPLE 2

An emulsion of electron-accepting compound was obtained in the same manner as in Comparative Example 1 except that the β-resorcin benzyl ester was replaced by 3-methacryloyloxpropyl 4-hydroxybenzoate and that 0.12 g of 2-o-chlorophenyl-4,5-diphenylimidazole dimer, 0.12 g of 7-diethylamino-4-methylcoumarin and, as an auxiliary to enhance polymerization, 0.06 g of N-phenylglycine ethyl ester were used. A light- and heat-sensitive recording medium was obtained by repeating the process of Comparative Example 1. When the resulting recording medium was subjected to light-exposure and heat developing treatment in the same manner as in Example 1, an image of magenta color was obtained but its color density was only 0.75.

Thus, the light- and heat-sensitive recording medium according the present invention has unexpected superiority in terms of a high color density at image part, a low fog density at non-image part and markedly high stability of the non-image part.

While the invention has been described in detail and with reference to specific examples thereof, it will be apparent to one skilled in the art that various changes and modifications can be made therein without departing from the spirit and scope thereof.

What is claimed is:

1. A recording medium which comprises a support having thereon at least one layer containing an electron-donating achromatic dye included in microcapsules and an electron-accepting compound, wherein said electron-accepting compound is represented by formula (i):

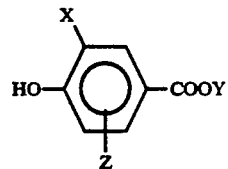

wherein X is a halogen atom, Y represents an acryloyloxyalkyl group or a methylacryloyloxyalkyl group, each having from 5 to 20 carbon atoms and Z represents a hydrogen atom, an alkyl group or an alkoxy group, each having from 1 to 5 carbon atoms.

2. A recording medium according to claim 1, wherein said electron-accepting compound is used in combination with a photo polymerization initiator.

3. A recording medium according to claim 1, wherein said electron-accepting compound is selected from the group consisting of β-vinylphenethyl 3-chloro-4-hydroxybenzoate, γ-vinylphenylpropyl 3-chloro-4-hydroxybenzoate, (2-acryloyloxyethyl) 3-chloro-4-hydroxybenzoate, (2-methacryloyloxyethyl) 3-chloro-4-hydroxybenzoate, (2-acryloyloxypropyl) 3-chloro-4-hydroxybenzoate, (2-methacryloyloxypropyl) 3-chloro-4-hydroxybenzoate, (3-acryloyloxypropyl) 3-chloro-4-hydroxybenzoate, (3-methacryloyloxypropyl) 3-chloro-4-hydroxybenzoate, (4-acryloyloxybutyl) 3-chloro-4-hydroxybenzoate, (4-methacryloyloxybutyl) 3-chloro-4-hydroxybenzoate, (2-acryloyloxyethyl) 3-fluoro-4-hydroxybenzoate, (5-methacryloyloxypentyl) 3-chloro-4-hydroxybenzoate, (5-acryloyloxypentyl) 3-chloro-4-hydroxybenzoate, (6-methacryloyloxyhexyl) 3-chloro-4-hydroxybenzoate and (6-acryloyloxyhexyl) 3-chloro-4-hydroxybenzoate.

4. A recording medium according to claim 1, wherein said electron-accepting compound is used in combination with a different polymerizable compound having at least one polymerizable ethylene group per molecule.

5. A recording medium according to claim 1, further comprising a spectral sensitization dye.

6. A recording medium according to claim 1, wherein said electron-donating achromatic dye is selected from the group consisting of triphenylmethanephthalide compounds, fluoran compounds, xanthene compounds, phenothiazine compounds, indolylphthalide compounds, leucoauramine compounds, rhodamine lactam compounds, triphenylmethane compounds, triazene compounds, spiropyran compounds, fluorene compounds, pyridine compounds and pyrazine compounds.

7. A recording medium according to claim 1, wherein 1 to 100 moles of said electron-accepting compound is used per 1 mole of said electron-donating achromatic dye.

8. A recording medium according to claim 1, comprising a plurality of said at least one layer.

9. A recording medium according to claim 1, wherein X represents a chlorine atom.

* * * * *